United States Patent [19]

Hokuyo

[11] Patent Number: 4,846,896
[45] Date of Patent: Jul. 11, 1989

[54] SOLAR CELL WITH INTEGRAL REVERSE VOLTAGE PROTECTION DIODE

[75] Inventor: Shigeru Hokuyo, Itami, Japan

[73] Assignee: Mitsubishi Denki Kabushiki Kaisha, Tokyo, Japan

[21] Appl. No.: 202,507

[22] Filed: Jun. 7, 1988

[30] Foreign Application Priority Data

Jul. 8, 1987 [JP] Japan .................................. 62-171596
Nov. 6, 1987 [JP] Japan .................................. 62-281613

[51] Int. Cl.$^4$ ........................ H01L 31/06; H01L 31/18
[52] U.S. Cl. .................................. 136/255; 136/244; 136/262; 437/2; 437/5
[58] Field of Search ................ 136/244, 255, 262; 437/2, 5

[56] References Cited

U.S. PATENT DOCUMENTS 3,887,935  6/1975  Fischer et al. ........................ 357/15
4,323,719  4/1982  Green .................................... 136/249
4,481,378  11/1984 Lesk ...................................... 136/244

FOREIGN PATENT DOCUMENTS 1320775  2/1963  France ................................. 136/255

OTHER PUBLICATIONS

Solar Cell Array Design Handbook, vol. 1, Jet Propulsion Laboratory, SP43-38, Oct. 1976, pp. 5.5-3 5.5-5.
"Improved Solar Generator Technology for the Eureca Low Earth Orbit", Photovoltaic generators in space, esa 267, No. 1986, pp. 115-121.

Primary Examiner—Aaron Weisstuch
Attorney, Agent, or Firm—Oblon, Spivak, McClelland, Maier & Neustadt

[57] ABSTRACT

In the fabrication processes of a solar cell, a first p-n junction having the function of supplying electric power to the exterior of the solar cell is formed in the vicinity of the light receiving surface, while a second p-n junction is provided in a position separated from the light receiving surface. The two p-n junctions are interconnected in anti-parallel, so that, when a reverse voltage is applied to the first p-n junction, the second p-n junction is forward biased to permit current flow therein, thereby preventing the solar cell from breaking down. Since the first and second p-n junctions are integrated with each other, the cost of fabricating the solar cell is decreased and the reliability thereof is improved.

13 Claims, 4 Drawing Sheets

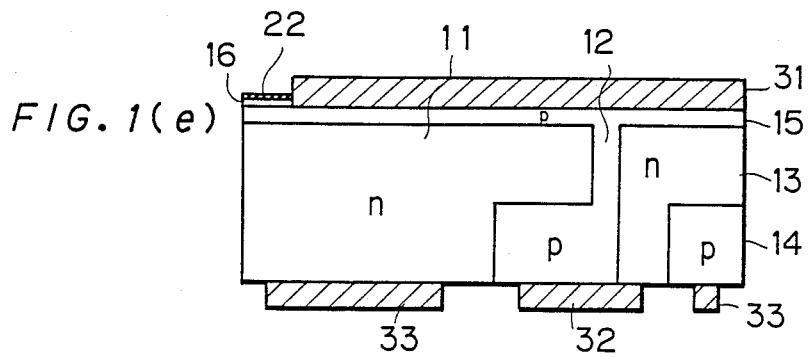
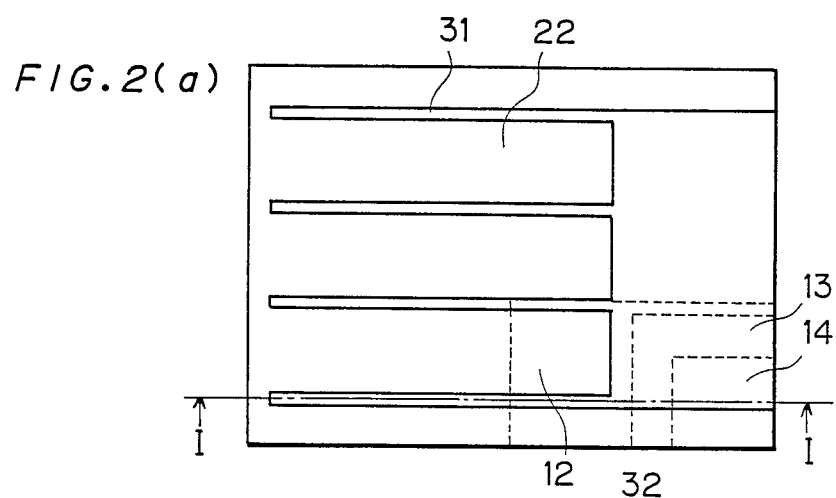
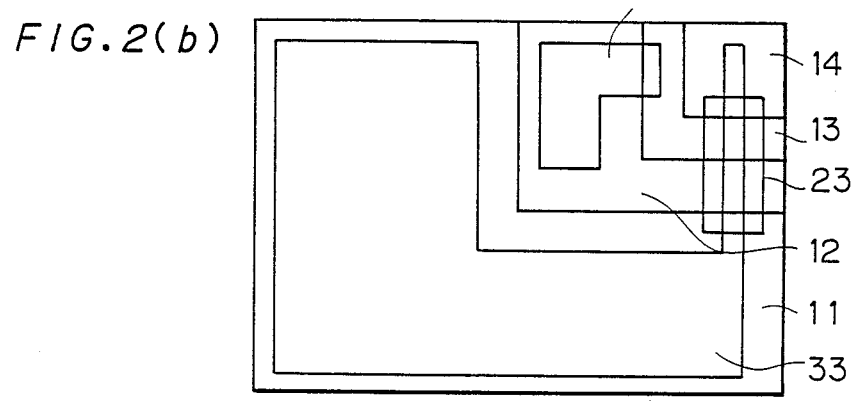

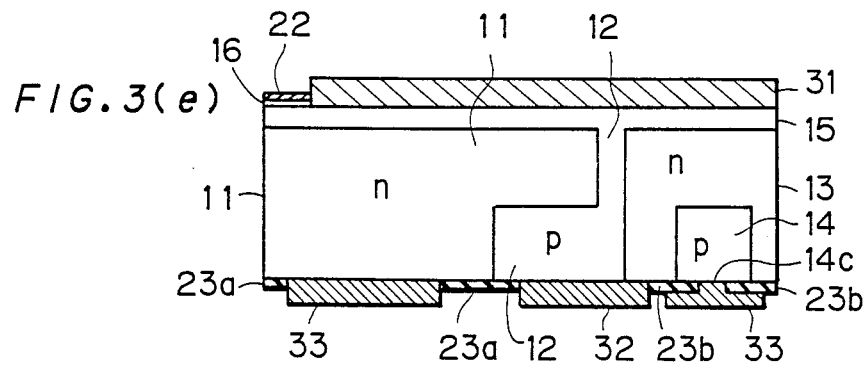
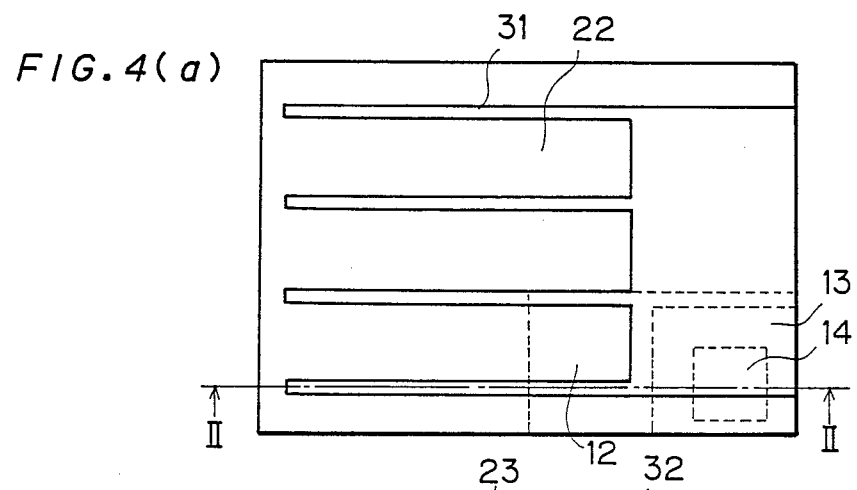
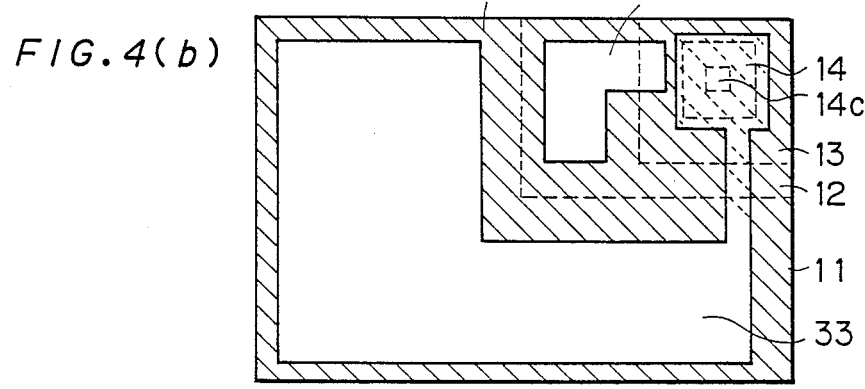

SOLAR CELL WITH INTEGRAL REVERSE VOLTAGE PROTECTION DIODE

BACKGROUND OF THE INVENTION

1. Field of the invention

The present invention relates to a solar cell employed in a photovoltaic generator in which a plurality of the solar cells are interconnected in series. More particularly, the present invention relates to a technique for preventing the solar cells from breaking down by a reverse voltage applied thereto when a part of the solar cells interconnected in series is shaded.

2. Description of the Prior Art

The fundamental structure of a conventional solar cell is a diode having a p-n junction. Accordingly, when it is employed in a practical power generator, a plurality of the solar cells should be interconnected in series so that the total voltage obtained by adding the voltages generated in respective solar cells reaches a desired voltage level.

When a part of the solar cells interconnected in series is shaded during power generating operation, only the shaded solar cell loses its power generating function. In this case, voltage generated in the other solar cells which are serially interconnected is applied to the shaded solar cell as a reverse voltage of the diode thereof. As a result, when the reverse breakdown voltage of the solar cell is low, the diode of the shaded solar cell is broken down, so that the function thereof required for photovoltaic power generation is lowered or lost. In order to prevent the shaded solar cell from breaking down, the reverse breakdown voltage of the solar cell should be improved, or alternately, another diode should be provided in anti-parallel relation to each solar cell whose generating voltage is lower than the reverse breakdown voltage of the individual solar cell.

The improvement of the reverse breakdown voltage of the solar cell may be achieved by decreasing the impurity concentration in the base layer thereof. In general, a solar cell should have a p-n junction provided at a shallow depth from the light receiving surface of the same, and especially in a solar cell used in cosmic space, the p-n junction must be provided at a shallow depth separated from the light receiving surface by a distance of 0.3 $\mu$m to 0.5 $\mu$m or less. Although it is possible in a laboratory to form the p-n junction by a diffusion process utilizing a base layer having low impurity concentration required for a reverse breakdown voltage of several hundred volts, the process is not usually applied to mass production of solar cells. Especially in a GaAs solar cell, it is difficult to obtain a low impurity concentrataion in the crystal growth process, and therefore, a reverse breakdown voltage over several ten volts cannot be obtained.

As hereinabove described, the improvement in the reverse breakdown voltage of a solar cell is limited in the conventional technique, and consequently conventional solar cells are not usually employed in a high voltage generation system.

On the other hand, use of an additional diode is effective for the protection of a solar cell. However, the insertion causes an increase in the number of components, so that the fabrication cost of the solar cell is increased and the reliability on the system is lowered. In particular, low reliability of a solar cell is a serious problem in cosmic space use or the like where extremely high reliability is required.

SUMMARY OF THE INVENTION

The present invention is directed to a solar cell having protection against reverse voltage breakdown and a fabrication method of the solar cell.

In one aspect of the present invention, the solar cell comprises: a first semiconductor (n) layer of a first conductivity type; a second semiconductor layer (p) of a second conductivity type contacting one major surface of said first semiconductor layer to form a p-n junction between said first and second semiconductor layers, a part of said second semiconductor layer extending from said one major surface to another major surface of said first semiconductor layer through said first semiconductor layer, whereby said first semiconductor layer is divided into a first semiconductor region having relatively large size and a second semiconductor region having relatively small size; and a third semiconductor region of said second conductivity type formed in a part of said another major surface's side of said second semiconductor region, said third semiconductor region being separated from said second semiconductor layer.

In another aspect of the present invention, a fabrication method of the solar cell comprises the steps of: (a) preparing a first semiconductor layer of a first conductivity type; (b) selectively diffusing impurities into said first semiconductor layer to form a second semiconductor layer extending from one major surface of said first semiconductor layer to another major surface of said first semiconductor layer through said first semiconductor layer, said second semiconductor layer dividing said first semiconductor layer into a first semiconductor region having relatively large size and a second semiconductor region having relatively small size; (c) selectively diffusing impurities into said second semiconductor layer from said another major surface's side to form a third semiconductor region of said second conductivity type being separated from said second semiconductor layer; and (d) forming a third semiconductor layer of said second conductivity type on at least a part of said one major surface of said first semiconductor layer, said third semiconductor layer being connected with said second semiconductor layer.

Accordingly, an object of the present invention is to provide a solar cell in which an additional diode structure is formed and connected with the same in anti-parallel, so that the solar cell is prevented from breaking down due to a reverse voltage applied thereto, while its fabrication cost is decreased and its reliability is improved.

Another object of the present invention is to provide a fabrication method for fabricating such a solar cell through practical processes.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1(a) through FIG. 1(e) are cross sections of a semiconductor wafer, serving to illustrate a sequence of process steps for the fabrication of a solar cell according to one embodiment of the present invention, FIG. 2(a) and FIG. 2(b) are a plan view and a bottom view, respectively of the solar cell of FIG. 1.

FIG. 3(a) through FIG. 3(e) are cross sections of a semiconductor slice, serving to illustrate the sequence of process steps for the fabrication of a solar cell according to another embodiment of the present invention, and FIG. 4(a) and FIG. 4(b) are a plan view and a bottom view, respectively of the solar cell of FIG. 3.

DESCRIPTION OF THE PREFERRED EMBODIMENTS

Figure 1A:
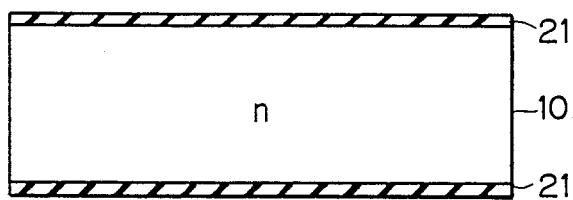

FIG. 1(a) through FIG. 1(e) are cross sections of a semiconductor slice showing the sequence of the process steps for the fabrication of a GaAs solar cell according to a preferred embodiment of the present invention. FIG. 2(a) and FIG. 2(b) are a plane view and a bottom view, respectively of the solar cell fabricated through the process steps shown in FIG. 1. FIG. 1(e) corresponds to a cross section of the solar cell taken along line I—I of FIG. 2(a). The same or corresponding components in FIG. 1 and FIG. 2 are provided with same reference numerals, respectively. Referring to FIG. 1 and FIG. 2, the process steps for the fabrication of the solar cell will be described below.

First, as shown in FIG. 1(a), a silicon nitride film 21 serving as a mask for selective diffusion is formed on the both surfaces of an n-type GaAs substrate (a first semiconductor layer) 10 by a CVD method.

Figure 1B:
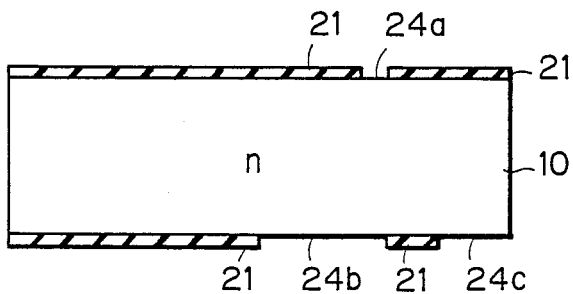

As shown in FIG. 1(b), a predetermined portion of the silicon nitride film 21 is removed by a photolithography technique to obtain windows 24a, 24b and 24e on both surfaces of n-type GaAs substrate 10.

Zn atoms are diffused from the both surface of the n-type GaAs substrate 10 through the windows 24a and 24b, so that a p-type GaAs layer (a second semiconductor layer) 12 having impurities of Zn is formed. The p-type GaAs layer 12 extends through the n-type GaAs substrate 10, thereby to divide the n-type GaAs substrate 10 into an n-type GaAs region (a first semiconductor region) 11 and an n-type GaAs region (a second semiconductor region) 13.

Figure 1C:
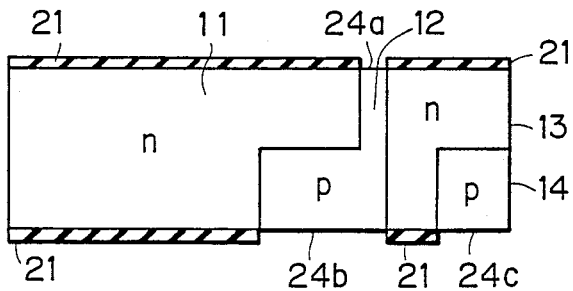

Simultaneously with the formation of the p-type GaAs layer 12, Zn atoms are diffused through the window 24c, so that a p-type GaAs region (a third semiconductor region) 14 separated from the p-type GaAs layer 12 is formed in the bottom surface of the n-type GaAs region 13, as shown in FIG. 1(c).

Figure 1D:
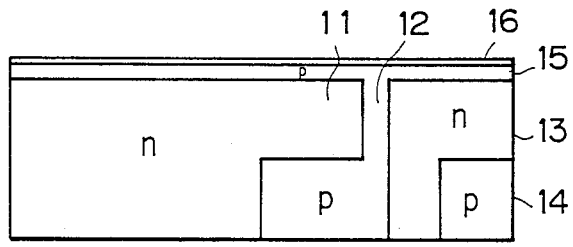

After removal of the silicon nitride film 21, a p-type GaAs layer (a third semiconductor layer) 15 of about 0.5 μm in thickness and connected with the p-type GaAs layer 12 is provided on the top surface serving as a light receiving surface by a crystal growth technique or the like, to form a p-n junction having a solar cell function, as shown in FIG. 1(d). A p-type AlGaAs layer 16 of about 0.5 μm to 0.1 μm in thickness is then provided on the p-type GaAs layer 15.

Next, a silicon nitride film ($Si_3N_4$) serving as an antireflection film is formed on the top surface of the semiconductor slice, and another silicon nitride film serving as an insulation film is formed on the bottom surface thereof. Predetermined portions of the silicon nitride films of both surfaces are then removed by a photolithography technique, and the p-type AlGaAs layer 16 is also removed except for a part thereof. As a result, the anti-reflection film 22 shown in FIG. 2(a) and the insulation film 23 shown in FIG. 2(b) are obtained on the top and bottom surfaces of the semiconductor slice, respectively.

As shown in FIG. 1(e), a grid electrode 31 is then provided on the top surface, and an anode electrode 32 and a cathode electrode 33 serving as first and second external connection electrodes, respectively, are formed on the bottom surface.

The anode electrode 32 extends from the area on the p-type GaAs layer 12 to the area on the n-type GaAs region 13. The cathode electrode 33 extends from the area on n-type GaAs region 11 to the area on the p-type GaAs region 14 through the areas on the p-type GaAs layer 12 and the n-type GaAs region 13, as shown in FIG. 2(b). Since the cathode electrode 33 is provided on the p-type GaAs layer 12 and the n-type GaAs region 13 with the insulation film 23 inserted therebetween, the cathode electrode 33 does not electrically contact the p-type GaAs layer 12 and the n-type GaAs region 13.

In the solar cell thus fabricated, a solar cell portion is made up of the p-type GaAs layers 12 and 15 and the n-type GaAs region 11, and a diode portion connected to the solar cell portion in anti-parallel is made up of the p-type GaAs region 14 and the n-type GaAs region 13.

When light is received on the top surface of the solar cell having the above described structure, photovoltaic power is generated between the p-type GaAs layer 15 and the n-type GaAs region 11, so that the structure functions as a solar cell in which positive and negative potentials appear at the anode electrode 32 and the cathode electrode 33, respectively.

During the power generating operation, the p-type GaAs layer 12 connected to the p-type GaAs layer 15 and the n-type GaAs region 13 are electrically short-circuited. Therefore photovoltaic power generated between the p-type GaAs layer 15 and the n-type GaAs region 13 does not contribute to the photovoltaic power generation for supplying electric power to the exterior of the solar cell.

On the other hand, the p-n junction consisting of the n-type GaAs region 13 and the p-type GaAs region 14 has the function of generating photovoltaic power in a direction opposite to the original power generating direction of the solar cell. However, the p-n junction between the regions 13 and 14 does not substantially deteriorate the solar cell function by reverse power generation, because of the following reasons:

(a) since the p-n junction is provided on the bottom side opposite to the top side (the light receiving surface), only a extremely small part of the light reaches the p-n junction, and especially in the GaAs solar cell or the like having a large photoabsorption coefficient, light having wave length(s) required for photovoltaic generation hardly reaches the p-n junction;

(b) the area of the p-n junction can be decreased by design to be sufficiently smaller than the effective power generating area; and (c) it is possible to prevent the incident light from reaching the p-n junction by providing an electrode metal layer on the top side.

In the above description, the influence of the light incident on the back and side surfaces of the solar cell, which are not the light receiving surfaces of the solar cell, is ignored. However, in some cases the influence may not be ignored. For such a case, another embodiment of the present invention will now be described.

Figure 3A:
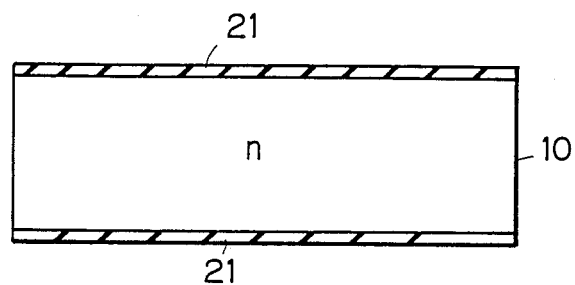
Figure 3B:
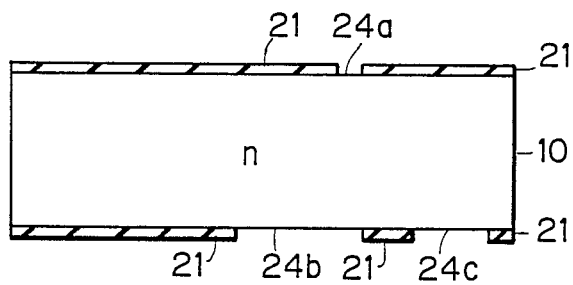
Figure 3C:
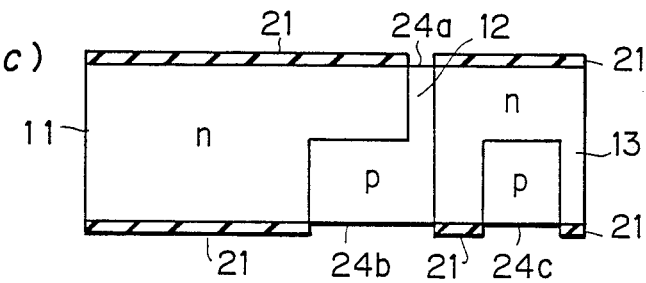
Figure 3D:
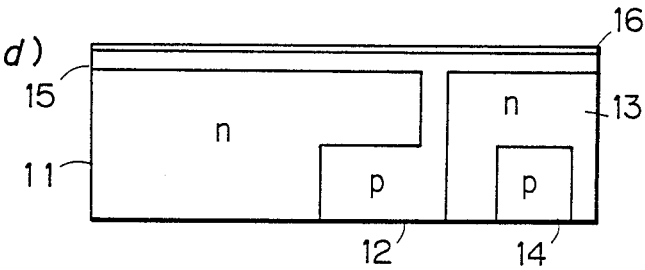

FIG. 3(a) to FIG. 3(e) are cross-sectional views showing manufacturing steps of the GaAs solar cell according to another embodiment of the present invention. FIG. 4(a) and FIG. 4(b) are plan view and a bottom view, respectively, of the solar cell manufactured through the steps shown in FIG. 3. FIG. 3(e) shows a cross-sectional view taken on the line II—II of FIG. 4(a). Each of the same or corresponding components in FIG. 3 and FIG. 4 is labeled the same reference numeral. Referring to FIG. 3 and FIG. 4, the manufacturing steps will now be described.

The steps shown in FIG. 3(a) to FIG. 3(d) are performed similarly to the aforementioned steps shown in FIG. 1(a) to FIG. 1(d) except for the position of a window 24c. The window 24c is formed at a distance of more than approximately 20 μm from the edge portion of n-type GaAs substrate 10. Therefore, a p-type GaAs region 14 defined by the window 24c is also formed at a distance of more than approximately 20 μm from the edge portion of the n-type GaAs substrate 10, i.e., the edge portion of the solar cell.

Formation of electrodes on the back surface of the substrate 10 is as follows: A silicon nitride film serving as an insulation film is formed on the back surface. The silicon nitride film is then removed in the predetermined portions by a photolithography technique to obtain an insulation film 23 (23a, 23b) shown in FIG. 3(e) and FIG. 4(b).

Then, an anode electrode 32 is formed on both p-type GaAs layer 12 and n-type GaAs region 13, while a cathode electrode 33 is formed such that it extends from the surface of n-type GaAs region 11 to the surface of p-type GaAs region 14 and is insulated from the p-type GaAs layer 12 and the n-type GaAs region 13 by the insulation film 23. The p-n junction defined by the p-type GaAs region 14 and the n-type GaAs region 13 is covered by the insulation film 23b and the cathode electrode 33 provided thereon, as shown in FIG. 3(e) and FIG. 4(b). The cathode electrode 33 is electrically connected to the p-type GaAs region 14 at the central portion 14c of the surface of the p-type GaAs region 14.

The formation of electrode 31 etc. at the top surface of the substrate 10 is similar to that in the embodiment illustrated in FIG. 1 and FIG. 2, and hence the description thereof is omitted.

The solar cell according to this embodiment has the following advantages in addition to the hereinbefore described advantages of the embodiment illustrated in FIG. 1 and FIG. 2.

The p-type GaAs region 14 is formed at a distance of greater than approximately 20 μm from the edge portion of the solar cell, and hence the p-n junction defined by the p-type GaAs region 14 and the n-type GaAs region 13 is located at a distance of greater than approximately 20 μm from the edge portion of the solar cell. As a result, the light incident on the edge portion of the solar cell cannot reach the p-n junction of the inverse/parallel diode formed by the p-type GaAs region 14 and the n-type GaAs region 13, since the GaAs solar cell material has a large photoabsorption coefficient, as hereinbefore described as item (a), so that the infiltration depth of the light having effective wave lengths for photovoltaic power generation is approximately 20 μm.

Further, the light incident on the back surface of the solar cell is reflected and absorbed by the cathode electrode 33 covering the p-n junction of the inverse/parallel diode, so as not to reach the p-n junction.

Thus, the influence due to the light incident on the back and side surfaces of the solar cell is removed. Therefore, photovoltage generation by the p-n junction of the inverse/parallel diode, which is reverse polarity to the voltage generation by the solar cell, can be completely prevented.

In a solar cell module constructed by interconnecting the solar cells in series through the alternate external connections of the respective anode electrodes 32 and cathode electrodes 33, when a part of the solar cells shaded, a reverse voltage is applied to the shaded solar cell, so that the anode electrode 32 and the cathode electrode 33 thereof are biased by negative and positive potentials, respectively. Since the anti-parallel diode portion consisting of the p-type GaAs region 14 and the n-type GaAs region 13 is forward biased in the shaded solar cell, a current flows from the cathode electrode 33 to the anode electrode 32 through the shaded solar cell to suppress the voltage between the electrodes 33 and 32. As a result, the reverse voltage is not substantially applied to the solar cell portion having a power generation function essentially required in the solar cell.

Although the GaAs solar cell is employed in the aforementioned embodiments, the present invention can be also applied to Si solar cells and other type solar cells. The cathode electrode 33 is formed to provide a short-circuit between the n-type GaAs region 11 and the p-type GaAs region 14 in the embodiment. However, it would be understood by those skilled in the art that elecrodes for the n-type GaAs region 11 and the p-type GaAs region 14 may be independently formed to be connected with each other through a connector provided in an assembly process, so that an effect similar to that of the embodiment is obtained.

As hereinabove described, a solar cell according to the present invention is so constructed that a first semiconductor layer of a first conductivity type is divided into a first semiconductor region and a second semiconductor region by forming a second semiconductor layer of a second conductivity type therebetween, and a third semiconductor region of the second conductivity type is provided in the other major surface of the second semiconductor layer while being separated from the second semiconductor layer. Therefore, the solar cell can have a reverse current flow path through the junction between the second semiconductor region and the third semiconductor region.

As a result, the solar cell is prevented from breaking down due to a reverse voltage applied thereto. Furthermore, since the number of components required for assembling a solar cell module is not increased, contrary to the conventional solar device in which a diode is externally provided in anti-parallel to the solar cell, the cost for fabricating the solar cell can be decreased and the reliability of the solar cell module can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar cell comprising:
   a first semiconductor layer of a first conductivity type;
   a second semiconductor layer of a second conductivity type contacting one major surface of said first semiconductor layer to form a main p-n junction between said first and second semiconductor layers, a part of said second semiconductor layer extending from said one major surface to another major surface of said first semiconductor layer through said first semiconductor layer, whereby said first semiconductor layer is divided into a first semiconductor region having relatively large size and a second semiconductor region having relatively small size;

a third semiconductor region of said second conductivity type formed in a part of said another major surface's side of said second semiconductor region, said third seminconductor region being separated from said second semiconductor layer with said second and third semiconductor regions forming a reverse voltage protective p-n junction;

a first connection means having a first external connection electrode extending from an area on said second semiconductor layer to an area on said second semiconductor region; and a second connection means having a second external connection electrode extending from an area on said first semiconductor region to an area on said third semiconductor region and insulation means for insulating said second external connection electrode from said second semiconductor layer and said second semiconductor region.

2. A solar cell in accordance with claim 1, wherein said second external connection electrode includes an electrode covering said p-n junction defined by said second and third semiconductor regions.

3. A solar cell in accordance with claim 1, wherein said first semiconductor layer, said second semiconductor layer, and said third semiconductor region comprises GaAs having impurities.

4. A solar cell in accordance with claim 1, wherein said p-n junction defined by said second and third semiconductor regions is located at a distance of greater than approximately 20 μm from an edge portion of said first semiconductor layer.

5. A solar cell in accordance with claim 1, wherein said first conductivity type is n-type, and said second conductivity type is p-type.

6. A solar cell in accordance with claim 5, wherein said p-type is obtained by introducing Zn atoms into GaAs crystal as impurities.

7. A solar cell in accordance with claim 1, wherein said insulation means comprises an insulation film of silicon nitride ($Si_3N_4$).

8. A method for fabricating a solar cell, comprising the steps of:

(a) preparing a first semiconductor layer of a first conductivity type;

(b) selectively diffusing impurities into said first semiconductor layer to form a second semiconductor layer extending from one major surface of said first semiconductor layer to another major surface of said first semiconductor layer through said first semiconductor layer, said second semiconductor layer dividing said first semiconductor layer into a first semiconductor region having relatively large size and a second semiconductor region having relatively small size;

(c) selectively diffusing impurities into said second semiconductor layer from said another major surface's side to form a third semiconductor region of said second conductivity type being separated from said second semiconductor layer;

(d) forming a third semiconductor layer of said second conductivity type on at least a part of said one major surface of said first semiconductor layer, said third semiconductor layer being connected with said second semiconductor layer; and (e) forming a first external connection electrode extending from an area on said second semiconductor layer to an area on said second semiconductor region; and (f) forming a second external connection electrode extending from an area on said first semiconductor region to an area on said third semiconductor region, said second external connection electrode being insulated from said second semiconductor layer and said second semiconductor region.

9. A fabrication method in accordance with claim 8, wherein said second external connection electrode is formed to cover said p-n junction defined by said second and third semiconductor regions.

10. A fabrication method in accordance with claim 8, wherein said first semiconductor layer, said second semiconductor layer, said third semiconductor layer, and said third semiconductor region comprises GaAs having impurities.

11. A fabrication method in accordance with claim 8, wherein said third semiconductor region is so formed that said p-n junction defined by said second and third semiconductor regions is located at a distance of more than approximately 20 μm from an edge portion of said first semiconductor layer.

12. A fabrication method in accordance with claim 1, wherein said first conductivity type is n-type, and
said second conductivity type is p-type.

13. A fabrication method in accordance with claim 12, wherein said p-type is obtained by introducting Zn atoms into GaAs crystal as impurities.

* * * * *

UNITED STATES PATENT AND TRADEMARK OFFICE
CERTIFICATE OF CORRECTION

PATENT NO. : 4,846,896

DATED : July 11, 1989

INVENTOR(S) : SHIGERU HOKUYO

It is certified that error appears in the above-identified patent and that said Letters Patent is hereby corrected as shown below:

In claim 8, subparagraph b), lines 2-3, change "a second semiconductor" to -- a second semiconductor of a second conductivity type --.

In claim 8, subparagraph c), lines 1-2, change "said second semiconductor layer" to -- said second semiconductor region --.

Signed and Sealed this

Fifth Day of March, 1991

Attest:

HARRY F. MANBECK, JR.

*Attesting Officer*   *Commissioner of Patents and Trademarks*